US012676389B2

(12) United States Patent
Kim

(10) Patent No.: US 12,676,389 B2
(45) Date of Patent: Jul. 7, 2026

(54) BATTERY MODULE HAVING IMPROVED ASSEMBLY STRUCTURE OF VOLTAGE SENSING COMPONENTS AND BATTERY PACK INCLUDING THE BATTERY MODULE

(71) Applicant: LG Energy Solution, Ltd., Seoul (KR)

(72) Inventor: Sung-Gyu Kim, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 600 days.

(21) Appl. No.: 18/024,440

(22) PCT Filed: Aug. 17, 2021

(86) PCT No.: PCT/KR2021/010900
§ 371 (c)(1),
(2) Date: Mar. 2, 2023

(87) PCT Pub. No.: WO2022/102918
PCT Pub. Date: May 19, 2022

(65) Prior Publication Data
US 2024/0030568 A1 Jan. 25, 2024

(30) Foreign Application Priority Data
Nov. 10, 2020 (KR) ........................ 10-2020-0149664

(51) Int. Cl.
*H01M 50/569* (2021.01)
*G01R 31/36* (2020.01)
(Continued)

(52) U.S. Cl.
CPC ........ *H01M 50/569* (2021.01); *G01R 31/364* (2019.01); *G01R 31/3644* (2013.01);
(Continued)

(58) Field of Classification Search
CPC ............. H01M 50/569; H01M 50/209; H01M 50/503; H01M 50/507; H01M 50/516;
(Continued)

(56) References Cited

U.S. PATENT DOCUMENTS

2006/0170396 A1 8/2006 Ha et al.
2013/0302651 A1 11/2013 Kim et al.
(Continued)

FOREIGN PATENT DOCUMENTS

CN 107771362 A 3/2018
CN 111029516 A 4/2020
(Continued)

OTHER PUBLICATIONS

Chan et al. (KR20170066896(A) and using Machine Translation as English version) (Year: 2017).*
(Continued)

*Primary Examiner* — Wyatt P Mcconnell
*Assistant Examiner* — Joshua P Mcclure
(74) *Attorney, Agent, or Firm* — Lerner David LLP

(57) ABSTRACT

A battery module according to the present disclosure includes: a cell stack including a plurality of battery cells that are stacked in one direction; and a sensing module located on a front portion or a rear portion of the cell stack for voltage sensing and electrical connection of the plurality of battery cells, wherein the sensing module includes: a main frame formed to cover a front surface or a rear surface of the cell stack and including a plurality of lead holes through which electrode leads of the plurality of battery cells are drawn out; a plurality of bus bars located on the main frame to be spaced apart from one another in one direction; and a printed circuit board formed of a rigid material, including a plurality of sensing tips detachably provided on corresponding bus bars, and attached to the main frame.

8 Claims, 8 Drawing Sheets

(51) Int. Cl.

| | |
|---|---|
| *G01R 31/364* | (2019.01) |
| *H01M 50/209* | (2021.01) |
| *H01M 50/503* | (2021.01) |
| *H01M 50/507* | (2021.01) |
| *H01M 50/516* | (2021.01) |
| *H01M 50/519* | (2021.01) |

(52) U.S. Cl.
CPC ....... *H01M 50/209* (2021.01); *H01M 50/503* (2021.01); *H01M 50/507* (2021.01); *H01M 50/516* (2021.01); *H01M 50/519* (2021.01)

(58) Field of Classification Search
CPC ............... H01M 50/519; G01R 31/364; G01R 31/3644
See application file for complete search history.

(56) References Cited

U.S. PATENT DOCUMENTS

| | | | |
|---|---|---|---|
| 2014/0003016 A1 | 1/2014 | McCabe et al. | |
| 2014/0212732 A1* | 7/2014 | Ichikawa ............ | H01M 50/507 174/68.2 |
| 2016/0240893 A1 | 8/2016 | Lee | |
| 2016/0248070 A1 | 8/2016 | Ahn | |
| 2017/0012331 A1* | 1/2017 | Ng .................... | H01M 10/0422 |
| 2018/0138484 A1 | 5/2018 | Choi et al. | |
| 2020/0014005 A1 | 1/2020 | Lee et al. | |
| 2020/0028143 A1 | 1/2020 | Xu et al. | |
| 2020/0144580 A1* | 5/2020 | Hong ................ | H01M 10/4257 |
| 2020/0152951 A1* | 5/2020 | O'Neil ................ | H01M 50/503 |
| 2020/0203698 A1 | 6/2020 | Jin et al. | |

| | | | |
|---|---|---|---|
| 2021/0151804 A1 | 5/2021 | You et al. | |
| 2021/0194101 A1 | 6/2021 | Kim et al. | |
| 2021/0313657 A1 | 10/2021 | Park et al. | |

FOREIGN PATENT DOCUMENTS

| | | | | | |
|---|---|---|---|---|---|
| CN | 111279515 | A | 6/2020 | | |
| JP | 2011243426 | A | 12/2011 | | |
| JP | 2020523766 | A | 8/2020 | | |
| KR | 100746485 | B1 | 8/2007 | | |
| KR | 20150050314 | A | 5/2015 | | |
| KR | 20150056885 | A | 5/2015 | | |
| KR | 101698765 | B1 | 1/2017 | | |
| KR | 20170066896 | A | * 6/2017 | ............. | H01M 2/26 |
| KR | 20170067007 | A | 6/2017 | | |
| KR | 20180091325 | A | * 8/2018 | ......... | H01M 10/425 |
| KR | 20180099438 | A | 9/2018 | | |
| KR | 20190071454 | A | 6/2019 | | |
| KR | 20200080074 | A | 7/2020 | | |
| KR | 20200124478 | A | 11/2020 | | |
| WO | WO-2019117514 | A1 | * 6/2019 | ........ | H01M 10/4257 |

OTHER PUBLICATIONS

Kim et al. (KR20180091325(A) and using Machine Translation as English version) (Year: 2018).*
Extended European Search Report including Written Opinion for EP App. No. 21892088.2 dated Sep. 27, 2024, 9 pages.
International Search Report for PCT/KR2021/010900 mailed Nov. 24, 2021. 4 pages.
Search Report dated Dec. 30, 2025 from the Office Action for Chinese Application No. 202180046032.3 issued Dec. 31, 2025, 2 pages.

* cited by examiner

BATTERY MODULE HAVING IMPROVED ASSEMBLY STRUCTURE OF VOLTAGE SENSING COMPONENTS AND BATTERY PACK INCLUDING THE BATTERY MODULE

CROSS REFERENCE TO RELATED APPLICATIONS

The present application is a national phase entry under 35 U.S.C. § 371 of International Application No. PCT/KR2021/010900 filed on Aug. 17, 2021 which claims priority to Korean Patent Application No. 10-2020-0149664 filed on Nov. 10, 2020 in the Republic of Korea, the disclosures of which are incorporated herein by reference.

TECHNICAL FIELD

The present disclosure relates to a battery module, and more particularly, to a battery module having an improved assembly structure of voltage sensing components such as a bus bar, a sensing member, and a connector required for voltage sensing of battery cells.

BACKGROUND ART

Semi-permanent batteries capable of converting electrical energy into chemical energy and repeated charging and discharging are referred to as secondary batteries to be distinguishable from primary batteries that may not be re-used after being used once.

Examples of secondary batteries include lithium secondary batteries, nickel cadmium (Ni—Cd) batteries, lead-acid batteries, nickel-metal hydride (Ni-MH) batteries, zinc-air batteries, and alkaline manganese batteries. Among them, lead-acid batteries and lithium secondary batteries may be most actively commercialized secondary batteries.

In particular, lithium secondary batteries have recently been actively used as batteries for electric vehicles because of advantages of high energy density, light weight, small size, excellent safety, low discharge rate, and long lifespan. For reference, lithium secondary batteries are generally classified into cylindrical, rectangular, and pouch-type batteries according to manufacturing shapes, and may be used as batteries for energy storage systems (ESS) and other electric devices in addition to batteries for electric vehicles.

Currently, a sufficient output to drive an electric vehicle may not be obtained from only one lithium secondary battery (cell). In order to apply a secondary battery as an energy source for an electric vehicle, a battery module in which a plurality of lithium-ion battery cells are connected in series and/or in parallel should be configured, and a battery pack including a battery management system (BMS) for connecting battery modules in series and functionally maintaining the battery modules, a cooling system, a battery disconnection unit (BDU), a harness wire, etc. is generally configured.

When a battery module includes pouch-type secondary battery cells as shown in FIG. 1, electrode leads 1a, 1b of the pouch-type secondary battery cells are welded to bus bars 3 located on a front portion or a front portion and a rear portion of the battery module for serial and/or parallel connection of the secondary battery cells.

A flexible printed circuit board (FPCB) 5 is connected to each bus bar 3 for voltage sensing of the secondary battery cells. Voltage information of the secondary battery cells is transmitted to a BMS (not shown) through a connector 7 mounted on the FPCB 5, and the BMS monitors a state of each secondary battery cell and controls charging and discharging based on the voltage information of the secondary battery cells.

In a battery module according to the prior art, each bus bar 3 is laser-welded to a corresponding sensing terminal 5a of each FPCB to connect the FPCB 5 to the bus bar 3. In this case, many welding defects occur and welding quality management is not easy. The FPCB, which is generally more expensive than a printed circuit boards (PCB), is often discarded due to welding defects in the above assembly process. Also, a connector pin of a connector is soldered on the FPCB. In this case, a connector mounting process is also not easy, and it is said that the connector including the connector pin soldered on the FPCB is vulnerable to impact or vibration.

SUMMARY

Technical Problem

The present disclosure is designed to solve the problems of the related art, and therefore the present disclosure is directed to providing a battery module in which an assembly structure of a bus bar, a sensing member, and a connector for voltage sensing is easier and more robust than that of the related art.

It will be easily understood by one of ordinary skill in the art that other objects of the present disclosure could be realized through means and combinations thereof shown in the following description and claims.

Technical Solution

According to an embodiment of the present disclosure, a battery module includes: a cell stack including a plurality of battery cells stacked in a single direction; and a sensing module located on a front portion or a rear portion of the cell stack for a voltage sensing and an electrical connection of the plurality of battery cells, wherein the sensing module includes: a main frame covering a front surface or a rear surface of the cell stack and including a plurality of lead holes through which electrode leads of the plurality of battery cells are extending; a plurality of bus bars located on the main frame and spaced apart from one another in a single direction; and a printed circuit board formed of a rigid material, and comprising a plurality of sensing tips configured to be detachable from corresponding bus bars, and attachable to the main frame.

The main frame may include: a bus bar mount portion recessed to each of the corresponding bus bars; and a board mount portion placed over or below the bus bar mount portion and recessed to the printed circuit board.

Each of the plurality of sensing tips may include: a base portion soldered to the printed circuit board; and a connecting portion extending from the base portion, and configured to be attachable to or detachable from the bus bar through forward or backward rotation.

The connecting portion may include a bent end portion, wherein each of the corresponding bus bars includes a slit into which the end portion of the connecting portion is press-fit.

The end portion of the connecting portion may include one or more convex-shaped beads.

The bus bar may be quadrangularly shaped and surround the outside of the lead hole.

The sensing module may further include a direct connector connected to an edge of the printed circuit board.

The direct connector may include: a connector housing including an upper plate portion contacting a first surface of the printed circuit board and a lower plate portion contacting a second surface of the printed circuit board, wherein the connector housing is engaged with the edge of the printed circuit board, wherein connector terminals are provided in the connector housing and configured to contact conductive lines provided on a surface of the printed circuit board.

An empty space may be provided between a portion of the edge of the printed circuit board and a front surface of the main frame to connect the connector housing.

According to another aspect of the present disclosure, a battery pack includes the battery module.

Advantageous Effects

According to an aspect of the present disclosure, a battery module in which an assembly structure of a bus bar, a sensing member, and a connector for voltage sensing is easier and more robust than that of the prior art may be provided.

According to the present disclosure, because a rigid printed circuit board is used as a sensing member and a sensing tip of the rigid printed circuit board may be detachably press-fit into a bus bar, the sensing tip and the bus bar may be easily assembled and re-work may be performed when necessary.

Also, according to the present disclosure, because an assembly structure is formed so that a connector is not mounted but is mechanically engaged with a printed circuit board, the connector may be more easily and firmly assembled on the rigid printed circuit board than in the prior art.

The effects of the present disclosure will be more clearly understood by the following embodiments of the present disclosure. It will also be easily understood that the effects of the present disclosure could be realized through means and combinations thereof shown in the claims of the present disclosure.

BRIEF DESCRIPTION OF THE DRAWINGS

FIG. 7 is a partial enlarged view of FIG. 6.

FIG. 8 is an enlarged view illustrating an assembly structure between a rigid printed circuit board and a connector, according to an embodiment of the present disclosure.

DETAILED DESCRIPTION

Figure 1:
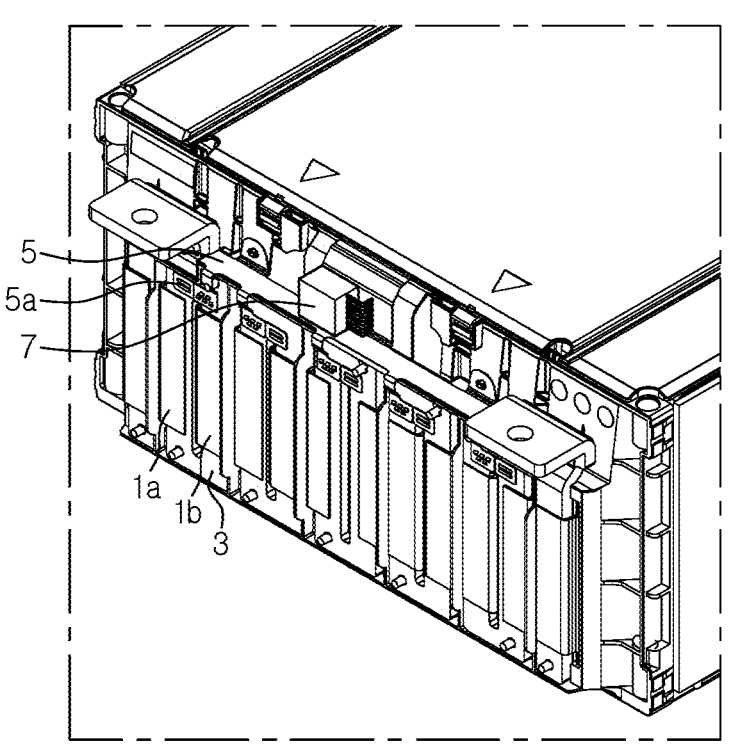
FIG. 1 is a partial perspective view illustrating a part of a front surface of a battery module according to the prior art.

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the present disclosure, so it should be understood that other equivalents and modifications could be made thereto without departing from the scope of the present disclosure.

These embodiments are provided so that this disclosure will be thorough and complete, and will fully convey the scope of the disclosure to one of ordinary skill in the art. Accordingly, the thickness and size of each element shown in the drawings may be exaggerated, omitted or schematically drawn for the purpose of clarity. Accordingly, the size of each element does not utterly reflect an actual size or ratio.

Figure 2:
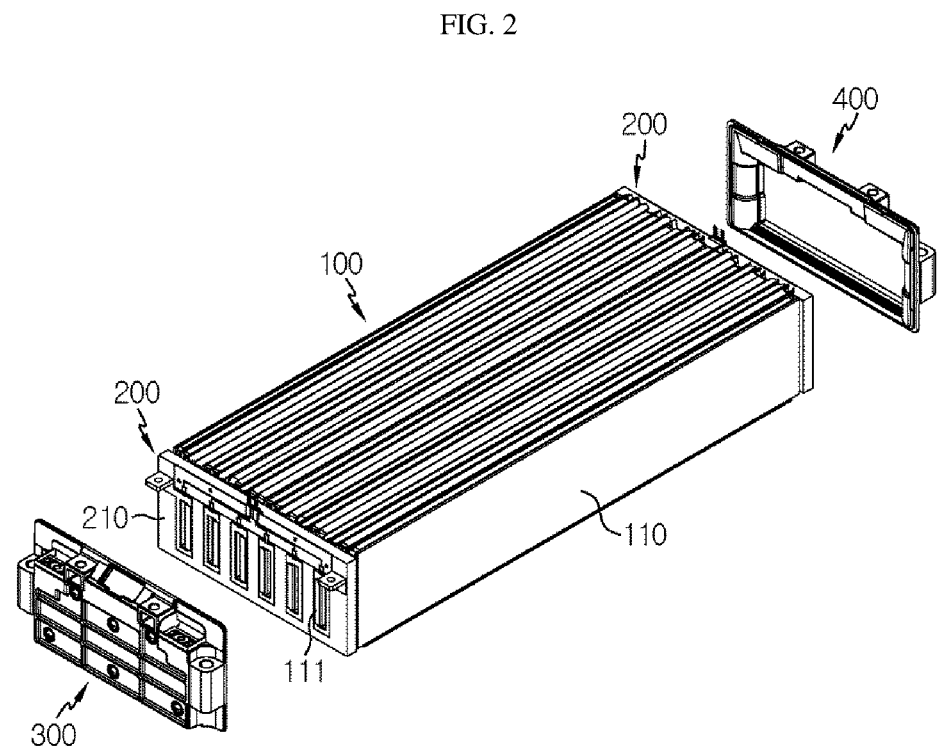
FIG. 2 is a perspective view illustrating a configuration of a battery module, according to an embodiment of the present disclosure.
Figure 3:
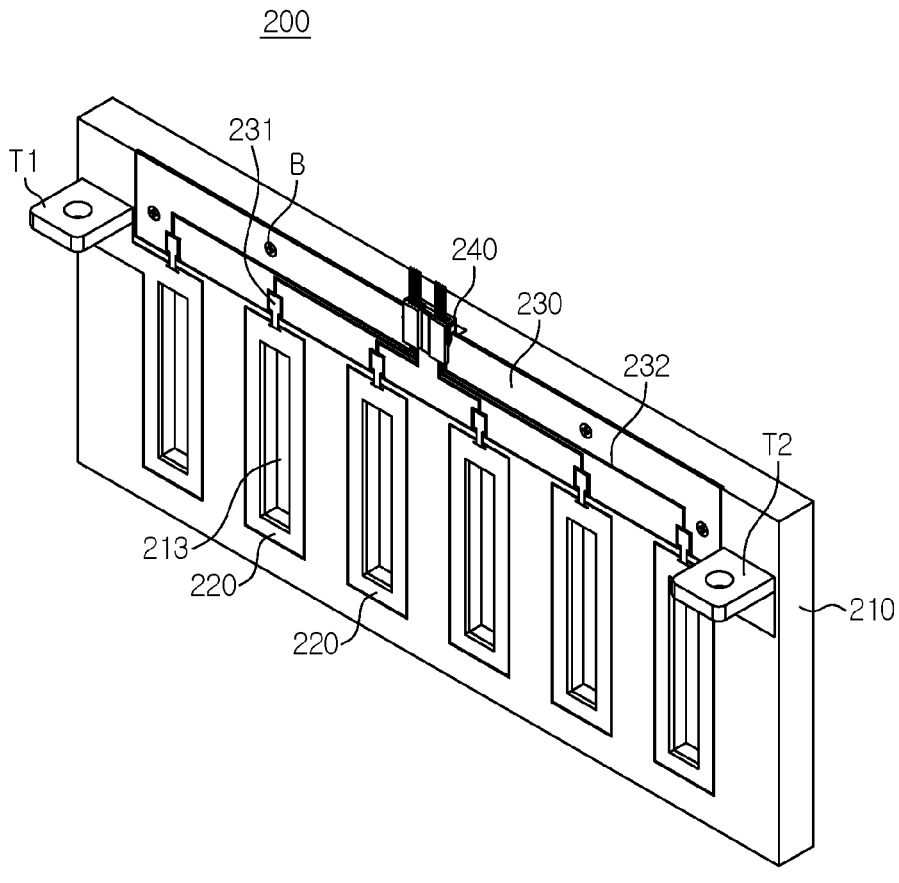
FIG. 3 is a perspective view illustrating a sensing module, according to an embodiment of the present disclosure.
Figure 4:
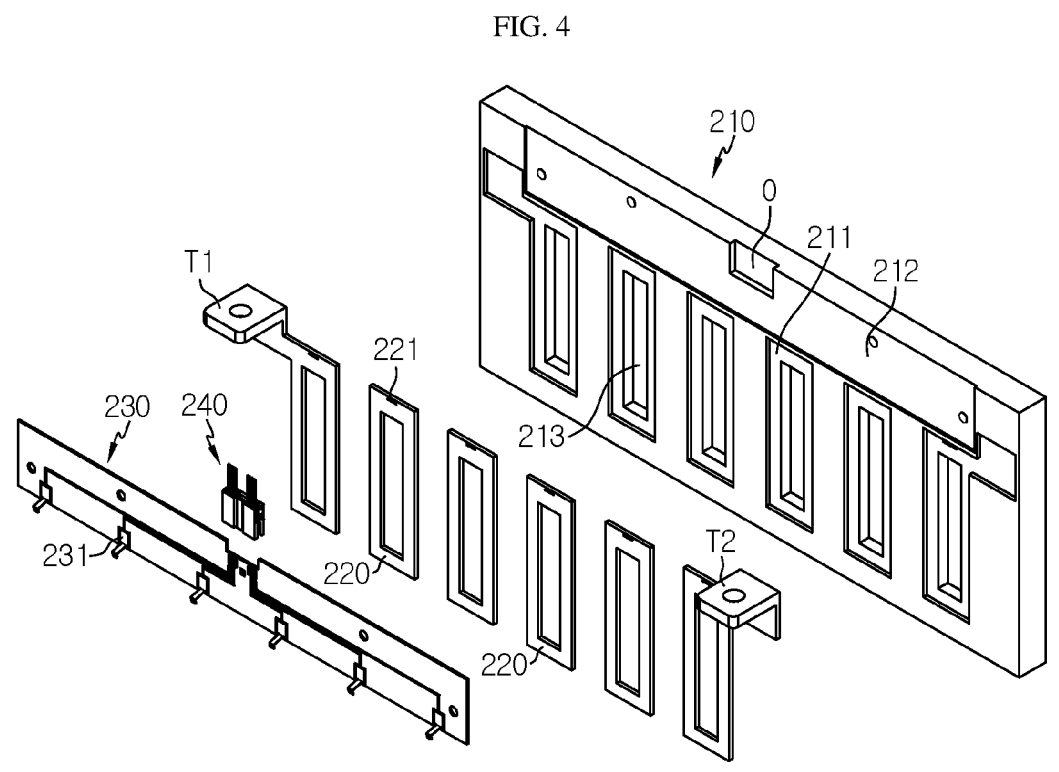
FIG. 4 is an exploded perspective view illustrating the sensing module of FIG. 3.

FIG. 2 is a perspective view illustrating a configuration of a battery module, according to an embodiment of the present disclosure. FIG. 3 is a perspective view illustrating a sensing module, according to an embodiment of the present disclosure. FIG. 4 is an exploded perspective view illustrating the sensing module of FIG. 3.

Referring to FIGS. 2 through 4, a battery module according to an embodiment of the present disclosure includes a cell stack 100, a sensing module 200, a front cover 300, and a rear cover 400.

The cell stack 100 may be a set of battery cells 110. For example, the cell stack 100 may be formed by erecting the battery cells 110 in an up-down direction and stacking the battery cells in a left-right direction. The battery cell 110 refers to a pouch-type battery cell 110. The battery cell 110 of the present embodiment is a bi-directional lead-type pouch-type battery cell in which a positive electrode lead and a negative electrode lead are located opposite to each other.

The pouch-type battery cell 110 includes an electrode assembly, an electrolytic solution, and a pouch casing for packaging the electrode assembly and the electrolytic solution. The electrode assembly has a structure in which a positive electrode plate, a separator, and a negative electrode plate are repeatedly stacked, and each of the positive electrode plate and the negative electrode plate includes an electrode tab. Inside the pouch casing, one or more electrode tabs are connected to an electrode lead 111, and the electrode lead 111 extends to the outside of the pouch casing to function as an electrode terminal of the battery cell 110.

The pouch casing for sealing and accommodating the electrode assembly and the electrolytic solution may include a metal thin film, for example, an aluminum thin film, to supplement electrochemical properties and improve heat dissipation of the electrode assembly and the electrolytic solution. The aluminum thin film may be located between an inner adhesive layer and an insulating layer formed of an insulating material to secure electrical insulation.

The sensing modules 200 are mounted on a front portion and a rear portion of the cell stack 10 where the electrode leads 111 of each battery cell 110 are located.

The sensing module 200 for electrical connection and voltage and temperature sensing of the battery cells 110 includes a main frame 210, a plurality of bus bars 220, a printed circuit board 230, and a direct connector 240.

The main frame 210 that is a plate-shaped structure may have an area corresponding to the front portion (or the rear portion) of the cell stack 100, and may be provided to cover a front surface (or a rear surface) of the cell stack 100. The main frame 210 may be formed of an insulating material such as plastic through injection molding.

The front portion (or the rear portion) of the cell stack 100 may be covered by the main frame 210, and the electrode leads 111 of each battery cell 110 may be drawn out through a plurality of lead holes 213 formed in the main frame 210 and may be welded to the corresponding bus bars 220.

The main frame 210 according to the present embodiment includes a bus bar mount portion 211, a board mount portion 212, and a connector connecting portion O on a front surface. The bus bar mount portion 211, the board mount portion 212, and the connector connecting portion O are provided for connection and separation between the bus bar 220 and a sensing tip 231 described below, stable installation of the rigid printed circuit board 230, and securing of a connection space of the direct connector 240.

The bus bar mount portions 211 are arranged in the left-right direction at a central portion of the main frame 210, and are each recessed to correspond to a shape of the bus bar 220 to be mounted. That is, the bus bar mount portion 211 has a width and a depth corresponding to a width and a thickness of the bus bar 220. Each bus bar 220 corresponding to the bus bar mount portion 211 is inserted so as not to form a stepped portion between a surface of the main frame 210 and a surface of the bus bar 220. In other words, when the bus bar 220 is inserted into the bus bar mount portion 211, the bus bar 220 does not protrude to the outside of the surface of the main frame 210.

The board mount portion 212 where the printed circuit board 230 is to be assembled may be provided over or under the bus bar mount portion 211. In the present embodiment, the board mount portion 212 is formed right over the bus bar mount portion 211. The board mount portion 212 is recessed to correspond to a shape of the printed circuit board 230. That is, the board mount portion 212 has a width and a depth corresponding to a width and a thickness of the printed circuit board 230. Like the bus bar mount portion 211, the printed circuit board 230 is inserted into the board mount portion 212 so as not to form a stepped portion between a surface of the main frame 210 and a surface of the printed circuit board 230. When the printed circuit board 230 is inserted into the board mount portion 212, the printed circuit board 230 may be fixed by using a bolt B or by using an adhesive or an adhesive tape instead of the bolt.

In this configuration, the surface of the bus bar 220 and the surface of the printed circuit board 230 are on the same plane. In this case, the bus bar 220 and the sensing tip 231 may be easily connected, which will be described below in detail.

The connector connecting portion O is a recessed portion of an edge of the board mount portion 212. Because the connector connecting portion O is provided, a space may be secured between an edge of the printed circuit board 230 and the main frame 210, and the direct connector 240 may be connected to be engaged with the edge of the printed circuit board 230 through the space.

Because the electrode lead 111 of the battery cell 110 has insufficient mechanical rigidity, the bus bar 220 is used for stable electrical connection of the battery cells 110. The bus bar 220 may be formed of copper, aluminum, or a clad metal thereof.

The plurality of bus bars 220 may be fixed by being conformably inserted into the busbar mount portion 211 of the main frame 210. Although not shown, an adhesive, a hook, or a bolt may be additionally used to fix the bus bars 220.

In the present embodiment, six bus bars 220 are arranged at equal intervals on the front main frame 210 of the cells tack 100, and five bus bars (not shown) are arranged at equal intervals on the rear main frame 210 of the cell stack 100. The bus bar 220 may be formed in any of various shapes such as a straight bar shape, a U-shape, or a quadrangular frame shape.

Among them, because the bus bar 220 having a quadrangular frame shape may be mounted on the main frame 210 to surround the outside of the lead hole 213, the electrode leads 111 may be drawn out from the lead hole 213, and then some of the electrode leads 111 may be welded to a left portion of a quadrangular frame and the rest may be welded to a right portion of the quadrangular frame, a large number of electrode leads 111 may be easily welded.

Accordingly, in the present embodiment, the bus bars 220 having a quadrangular frame shape are used. Two of the bus bars 220 serve as a positive electrode terminal and a negative electrode terminal of the battery module. To this end, shapes of a positive electrode terminal T1 and a negative electrode terminal T2 are added to the first bus bar 220 and the sixth bus bar 220 that are outermost bus bars on the front main frame 210.

In this configuration, positive electrode leads of the battery cells 110 of a first group are welded to the first bus bar 220 of the front main frame 210, and negative electrode leads of the battery cells 110 of the first group are welded along with positive electrode leads of the battery cells 110 of a second group to the first bus bar 220 of the rear main frame 210. Next, negative electrode leads of the battery cells 110 of the second group and positive electrode leads of the battery cells 110 of a third group are welded to the second bus bar 220 of the front main frame 210. In this pattern, negative electrode leads of the battery cells 110 of a last group are welded to the sixth bus bar 220 of the front main frame 210. (The battery cells 110 of an $N^{th}$ group refer to a bundle of one or more battery cells 110.) In this case, all of the battery cells 110 constituting the cell stack 100 may be connected in series and/or in parallel through the plurality of bus bars 220.

As described above, the battery cells 110 are connected in series through the bus bars 220 in units of groups or bundles. In this case, a voltage of each of the battery cells 110 that are connected in series may be determined by measuring a voltage at each bus bar 220.

The printed circuit board 230 may be used as a sensing member for sensing a voltage at each bus bar 220. Because the printed circuit board 230 may transmit a lot of signals or power while occupying a small space in the battery module, the printed circuit board 230 may be effectively used as a voltage sensing member.

A flexible printed circuit board (FPCB) capable of three-dimensional (3D) wiring has been widely used as a sensing member in the prior art. However, the FPCB has problems in that the FPCB is vulnerable to impact and is expensive, and laser welding should be performed when the FPCB is connected to the bus bar 220 as described in the background art. Accordingly, the present disclosure uses the printed circuit board 230 formed of a rigid material which may be firmly attached to the main frame 210, instead of the FPCB.

As shown in FIGS. 3 and 4, the printed circuit board 230 formed of a rigid material according to an embodiment of the present disclosure may include a plurality of sensing tips 231 detachably provided on the bus bars 220 and conductive lines 232 each configured to transmit a signal of each sensing tip 231, and may be fixedly attached to the board mount portion 212. In this case, because the printed circuit board 230 is formed of a rigid material, the printed circuit board 230 may be firmly fixed to the board mount portion 212 by using the bolt B.

Each of the plurality of sensing tips 231 may include a base portion 231*a* soldered to the printed circuit board 230 and a connecting portion 231*b* extending by a certain length from the base portion 231*a* and attached to or detached from the bus bar 220 through forward or backward rotation.

Figure 5:
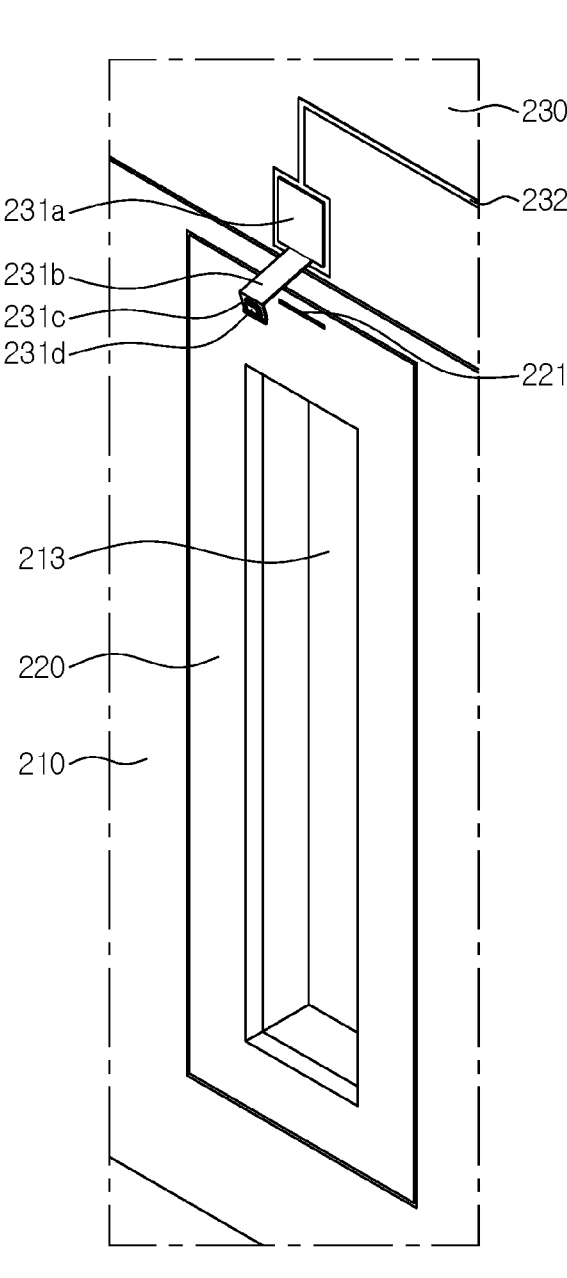
FIG. 5 is a view illustrating a state before a sensing tip and a bus bar are connected, according to an embodiment of the present disclosure.

Also, the connecting portion 231*b* includes an end portion 231*c* that is bent at an angle of about 90°, as shown in FIG. 5. The bus bar 220 includes a slit 221 formed by being cut by a certain depth in a thickness direction. The slit 221 is formed at a position where the end portion 231*c* of the connecting portion 231*b* may be inserted when the sensing tip 231 rotates.

Figure 6:
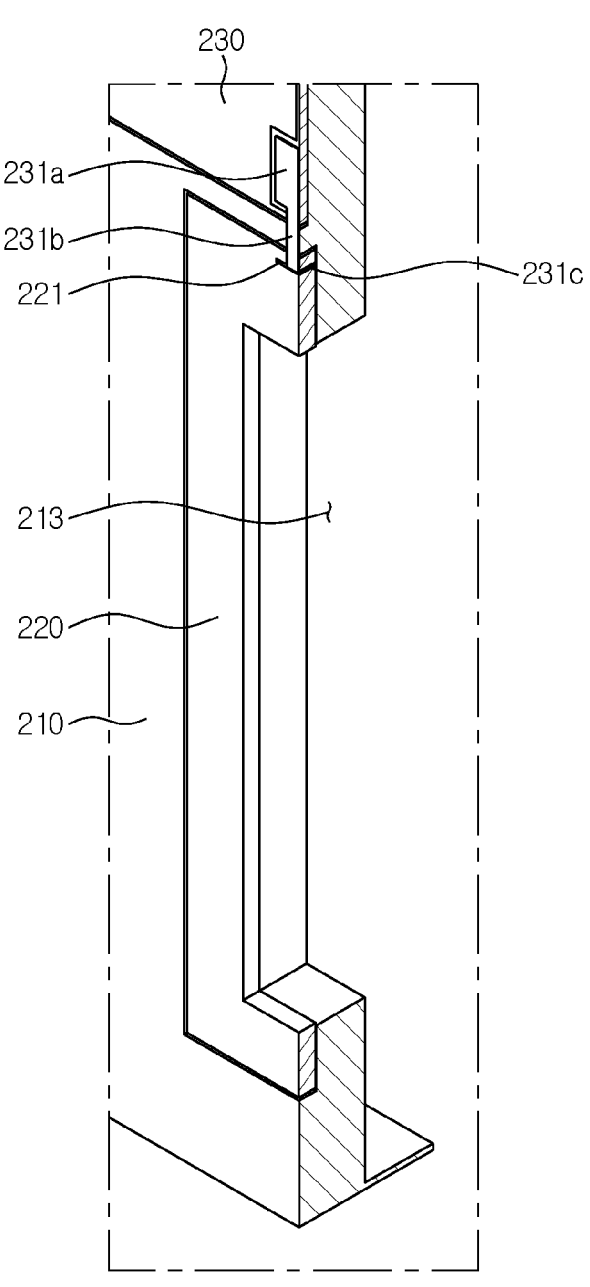
FIG. 6 is a cross-sectional view illustrating a state after the sensing tip and the bus bar are connected, according to an embodiment of the present disclosure.

In these configurations, as shown in FIG. 6, by rotating the connecting portion 231*b* of the sensing tip 231 in a state where the bus bar 220 and the printed circuit board 230 are attached to the main frame 210, the end portion 231*c* of the connecting portion 231*b* may be press-fit into the slit 221 of the bus bar 220.

As described above, the bus bar 220 and the printed circuit board 230 are respectively located on the bus bar mount portion 211 and the board mount portion 212 so that a surface of the bus bar 220 and a surface of the printed circuit board 230 are on the same plane. Accordingly, when the end portion 231*c* of the connecting portion 231*b* is inserted into the slit 221 of the bus bar 220 by rotating the connecting portion 231*b* of the sensing tip 231, the remaining portion of the connecting portion 231*b* may be closely attached in parallel to the surface of the connecting portion 231*b*.

Figure 7:
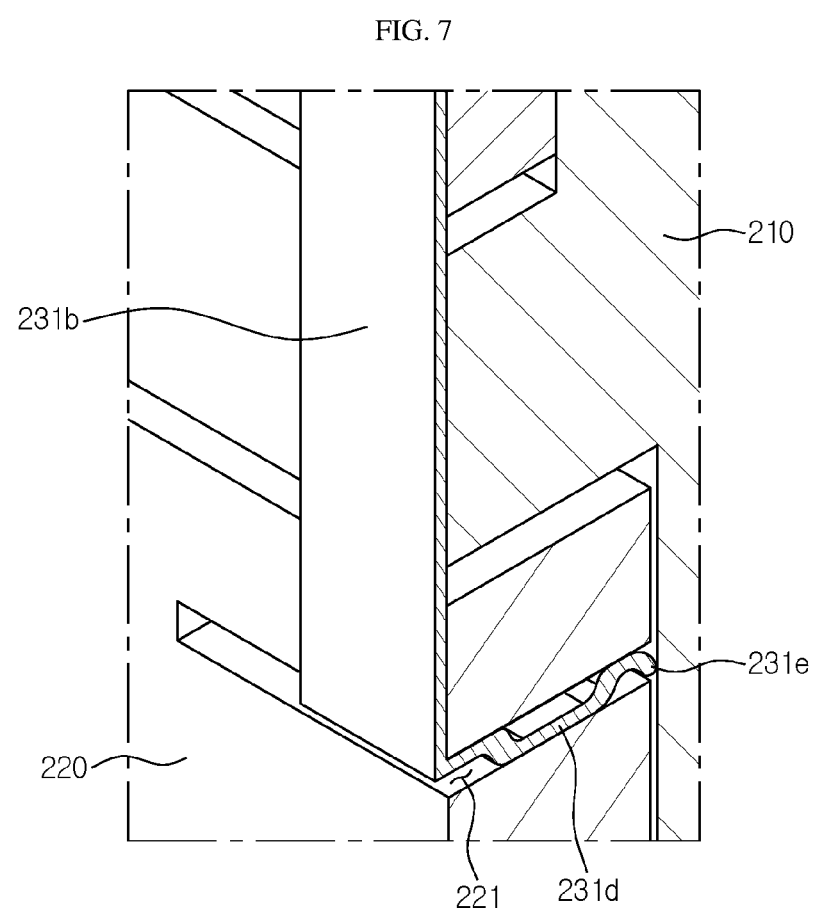

Also, the sensing tip 231 may include at least one bead 231*d* formed in a convex pattern on the end portion 231*c* of the connecting portion 231*b*. Referring to FIG. 7, the sensing tip 231 according to the present embodiment includes the bead 231*d* in an uneven or convex pattern on the end portion 231*c* of the connecting portion 231*b*. When the end portion 231*c* of the connecting portion 231*b* is inserted into the slit 221 of the bus bar 220, a portion of the bead 231*d* collides with an inner wall surface of the slit 221 and is compressed. In this case, a restoring force of the bead 231*d* is applied, so that contact between the inner wall surface of the slit 221 and the bead 231*d* is strongly maintained.

Also, in order to allow an end of the end portion 231*c* of the connecting portion 231*b* to be caught outside the slit 221, the end of the end portion 231*c* of the connecting portion 231*b* may have a loop shape 231*e* so that the connecting portion 231*b* is not easily separated from the slit 221.

In this configuration, when the sensing tip 231 and the bus bar 220 are connected, the connection may be easily and rapidly performed and separation may be performed when necessary, and thus it is also possible to replace only one of the bus bar 220 and the printed circuit board 230, compared to laser welding between the sensing tip 231 and the bus bar 220.

The direct connector 240 may be used to transmit voltage information of the battery cells 110 sensed by the sensing tips 231 of the printed circuit board 230 to a battery management system (BMS) (not shown).

Figure 8:
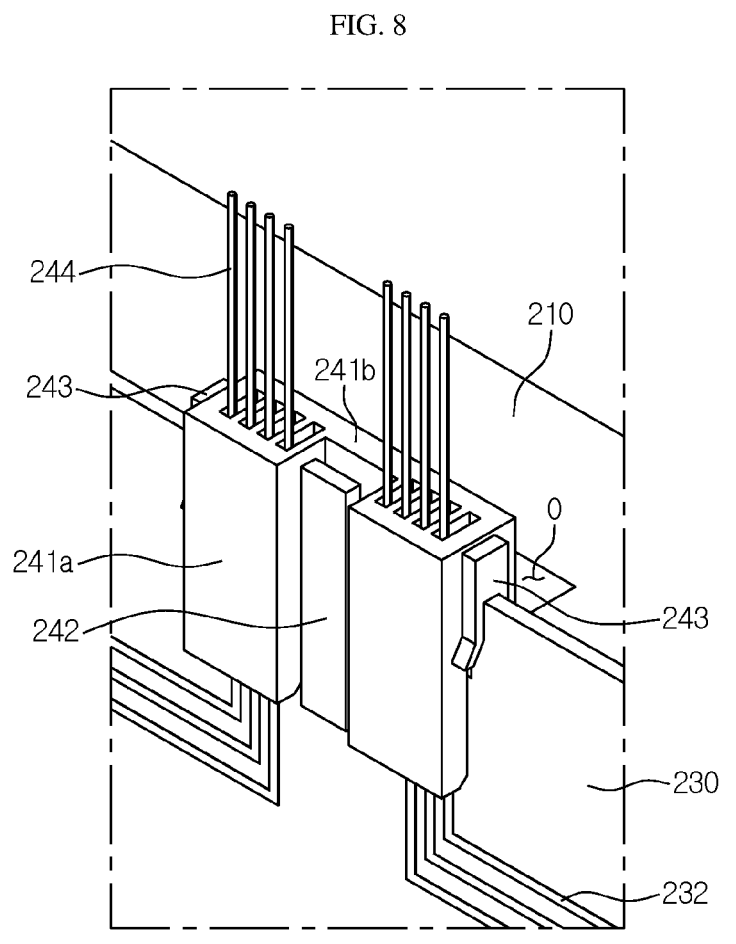

The direct connector 240 according to an embodiment of the present disclosure may be provided to be directly connected to an edge of the printed circuit board 230, as shown in FIG. 8.

In detail, the direct connector 240 may include a connector housing inserted into and engaged with the printed circuit board 230, a plurality of connector terminals provided in the connector housing, and a plurality of cables 244 connected in a one-to-one manner to the plurality of connector terminals and extending to the outside.

The connector housing includes an upper plate portion 241*a* and a lower plate portion 241*b* forming a space for accommodating the connector terminals, and a latch portion 242 and a board holding lead 243 forming a locking means for the printed circuit board 230.

The upper plate portion 241*a* and the lower plate portion 241*b* may form a body of the connector housing. The upper plate portion 241*a* and the lower plate portion 241*b* are formed so that front portions are spaced apart from each other by a thickness of the printed circuit board 230 to be inserted by a certain depth into an edge of the printed circuit board 230 and rear portions are connected to each other to form one body.

When the connector housing is connected to the edge of the printed circuit board 230, the front side of the upper plate portion 241*a* contacts a front surface of the printed circuit board 230 and the front side of the lower plate portion 241*b* contacts a rear surface of the printed circuit board 230, and the latch portion 242 and the board holding lead 243 are additionally coupled to the printed circuit board 230, to prevent movement of the direct connector 240. Insertion holes into which the connector terminals may be individually inserted may be formed in the rear portions of the upper plate portion 241*a* and the lower plate portion 241*b*.

Also, in the present embodiment, an empty space is provided between a portion of the edge of the printed circuit board 230 and a front surface of the main frame 210. The empty space corresponds to the connector connecting portion O of the main frame 210. Because the lower plate portion 241*b* of the connector housing may be located in the empty space, the direct connector 240 may be connected to the edge of the printed circuit board 230 without being interfered with an upper end of the main frame 210.

As described above, in the battery module according to the present disclosure, because the sensing tip 231 of the printed circuit board 230 may be detachably press-fit into the bus bar 220, the sensing tip 231 and the bus bar 220 may be easily assembled and re-work may be performed when necessary. Also, because an assembly structure is formed so that the direct connector 240 is mechanically engaged with the printed circuit board 230, the connector may be more firmly and easily installed than in the prior art.

A battery pack according to the present disclosure may include one or more battery modules according to the present disclosure. Also, the battery pack according to the present disclosure may further include, in addition to the battery modules, a pack case for accommodating the battery modules, and various devices for controlling charging and discharging of each battery module, for example, a master BMS, a current sensor, and a fuse.

The battery module according to the present disclosure may be applied to a vehicle such as an electric vehicle or a hybrid vehicle. That is, the vehicle may include the battery module according to the present disclosure.

While one or more embodiments of the present disclosure have been described with reference to the embodiments and figures, the present disclosure is not limited thereto, and it will be understood by one of ordinary skill in the art that various changes in form and details may be made therein without departing from the scope of the present disclosure as defined by the following claims.

It will be understood by one of ordinary skill in the art that when terms indicating directions such as upper, lower, left, right, front, and rear are used, these terms are only for convenience of explanation and may vary according to a position of a target object, a position of an observer, etc.

What is claimed is:

1. A battery module comprising:
a cell stack comprising a plurality of battery cells stacked in a single direction; and
a sensing module located on a front portion or a rear portion of the cell stack for a voltage sensing and an electrical connection of the plurality of battery cells,
wherein the sensing module comprises:
a main frame covering a front surface or a rear surface of the cell stack, and comprising a plurality of lead holes through which electrode leads of the plurality of battery cells are extending;
a plurality of bus bars located on the main frame and spaced apart from one another in a single direction; and
a printed circuit board formed of a rigid material, and comprising a plurality of sensing tips configured to be detachable from corresponding bus bars, and attachable to the main frame, wherein each bus bar of the plurality of bus bars includes a slit for receiving a connecting portion of a corresponding sensing tip, the connecting portion having a bent end and one or more convex-shaped beads, wherein each bus bar is attachable to the printed circuit board when the corresponding sensing tip is rotated forward from the printed circuit board, and detachable when the corresponding sensing tip is rotated backward, and wherein insertion of the bent end and the one or more convex-shaped beads into the slit causes the one or more convex-shaped beads to contact and compress against an inner wall of the slit, generating a restoring force that maintains the contact.

2. The battery module of claim 1, wherein the main frame comprises:
a bus bar mount portion recessed to correspond to each of the plurality of bus bars; and
a board mount portion placed over the bus bar mount portion and recessed to the printed circuit board.

3. The battery module of claim 1, wherein each of the plurality of sensing tips comprises:
a base portion soldered to the printed circuit board; and
the connecting portion extending from the base portion, and configured to be attachable to or detachable from each of the corresponding bus bars through forward or backward rotation.

4. The battery module of claim 1, wherein each of the plurality of bus bars is quadrangularly shaped and surrounds the outside of the lead hole.

5. The battery module of claim 1, wherein the sensing module comprises a direct connector connected to an edge of the printed circuit board.

6. The battery module of claim 5, wherein the direct connector comprises: a connector housing comprising an upper plate portion contacting a first surface of the printed circuit board and a lower plate portion contacting a second surface of the printed circuit board, wherein the connector housing is engaged with the edge of the printed circuit board, wherein connector terminals are provided in the connector housing and configured to contact conductive lines provided on a surface of the printed circuit board.

7. The battery module of claim 6, wherein an empty space is provided between a portion of the edge of the printed circuit board and a front surface of the main frame to connect the connector housing.

8. A battery pack comprising the battery module according to claim 1.

* * * * *